(12) United States Patent
Ovshinsky (10) Patent No.: US 6,969,867 B2
(45) Date of Patent: Nov. 29, 2005

(54) FIELD EFFECT CHALCOGENIDE DEVICES

(75) Inventor: Stanford R. Ovshinsky, Bloomfield Hills, MI (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 0 days.

(21) Appl. No.: 10/426,321

(22) Filed: Apr. 30, 2003

(65) Prior Publication Data

US 2004/0178403 A1 Sep. 16, 2004

Related U.S. Application Data

(63) Continuation-in-part of application No. 10/384,994, filed on Mar. 10, 2003.

(51) Int. Cl.[7] .............................................. H01L 47/00
(52) U.S. Cl. ..................... 257/4; 257/2; 257/3; 257/5; 257/6; 257/40; 257/673; 257/686; 257/727
(58) Field of Search .................. 257/2, 3, 4, 5, 257/66, 629, 686, 673, 611, 777, 40, 41, 42, 257/672, 674, 688, 778

(56) References Cited

U.S. PATENT DOCUMENTS

| | | | | |
|---|---|---|---|---|
| 3,872,492 A | * | 3/1975 | Robbins | 257/66 |
| 4,015,282 A | * | 3/1977 | Shaw | 257/2 |
| 5,760,462 A | * | 6/1998 | Barron et al. | 257/629 |
| 2003/0096497 A1 | * | 5/2003 | Moore et al. | 438/652 |

* cited by examiner

*Primary Examiner*—Nathan J. Flynn
*Assistant Examiner*—Fazli Erdem
(74) *Attorney, Agent, or Firm*—Kevin L. Bray; Marvin S. Siskind (57) ABSTRACT

Multi-terminal field effect devices comprising a chalcogenide material. The devices include a first terminal, a second terminal and a field effect terminal. Application of a gate signal to the field effect terminal modulates the current passing through the chalcogenide material between the first and second terminals and/or modifies the holding voltage or current of the chalcogenide material between the first and second terminals. The devices may be used as interconnection devices in circuits and networks to regulate current flow between circuit or network elements.

12 Claims, 2 Drawing Sheets

FIELD EFFECT CHALCOGENIDE DEVICES

CROSS-REFERENCE TO RELATED APPLICATIONS

This application is a continuation-in-part of application Ser. No. 10/384994, filed Mar. 10, 2003, the disclosure of which is herein incorporated by reference.

FIELD OF THE INVENTION

This invention relates generally to electronic devices that regulate electrical current. More particularly, this invention relates to chalcogenide devices exhibiting transistor-like properties. Most particularly, this invention pertains to multi-terminal chalcogenide devices in which the application of an electrical signal at a gate terminal modulates the flow of electrical current between a source terminal and a drain terminal of the device.

BACKGROUND OF THE INVENTION

Today's electronic devices rely on conventional silicon technology. With silicon technology, one can fabricate the electronic components (e.g. transistors, diodes, switches, memory, integrated circuits and processors) needed to produce modern computers and consumer electronic products. Silicon-based electronics have been remarkably successful in the market place and have provided a number of conveniences that have greatly simplified everyday life.

The growth of silicon-based electronics over the past few decades has been propelled by the enormous strides that have been made in the miniaturization of devices during manufacturing. Miniaturization trends have faithfully followed Moore's Law for many years over many generations of silicon technology. As device feature sizes decrease, it becomes possible to include ever more devices in a given area of a silicon wafer and to achieve improved performance and speed from computers and electronic products.

Since future improvements in computing power and functionality are currently predicated on further improvements in silicon technology, there has been much recent discussion about the prognosis for continued miniaturization of silicon-based electronic devices. A growing consensus is emerging that believes that the computer industry is rapidly approaching the performance limits of silicon. The feature size in today's manufacturing technologies is 0.18 micron and it is expected that this can be reduced to about 0.10 micron in the future. Further decreases in feature size, however, are deemed problematic because sizes below about 0.10 micron lead to a change in the fundamental behavior of silicon. More specifically, as the dimensions of silicon devices decrease to tens of nanometers and below, silicon enters the quantum regime of behavior and no longer functions according to the classical physics that governs macroscopic objects. In the quantum regime, energy states are quantized rather than continuous and phenomena such as tunneling lead to delocalization of electrons across many devices. Consequences of tunneling include leakage of current as electrons escape from one device to neighboring devices and a loss of independence of devices as the state of one device influences the state of neighboring devices. In addition to fundamental changes in the behavior of silicon, further decreases in the dimensions of silicon devices also pose formidable technological challenges. New innovations in fabrication methods such as photolithography will be needed to achieve smaller feature sizes.

Two other drawbacks of silicon technology have been identified. First, the costs of installing and operating new manufacturing facilities have increased exponentially as feature sizes have decreased. At today's 0.18 micron feature size, for example, the cost of building a new semiconductor fabrication facility exceeds a billion dollars. This cost will only increase as devices become smaller and more susceptible to impurities and process contamination. Second, there is growing recognition that the functionality of silicon-based computers is inherently limited as certain computations remain largely unamenable to solution by modem computers. Examples include factoring, parallel computing, pattern recognition and associative memory. Similarly, many tasks that are readily and intuitively performed by humans and other biological organisms are difficult, cumbersome and oftentimes impossible to implement with conventional computers.

Consideration of the future of computing indicates a need for new computers with new functionality to address ever more sophisticated applications. New computers that are adaptable and flexible and that operate according to reasoning and intelligence are needed. A need exists for computers that are not limited to the rigid, brute force problem solving methodology of conventional computers. Instead, computers are needed that can respond to changing situations with an ability to discriminate information from multiple sources to provide reasoned outputs, even in the face of seemingly conflicting circumstances. The functionality required to achieve intelligent computers and devices extends beyond the current and projected performance capabilities of the silicon technology underlying conventional computers. Consequently, a need exists for a new and revolutionary computing paradigm, based at least in part on new non-silicon computing media, that encompasses general purpose computers and task-specific computing devices. In order to achieve this goal, a need exists for the development of and interconnection strategies for non-silicon based electronic devices and components as well as the interfacing of these devices and components with conventional silicon.

SUMMARY OF THE INVENTION

The instant invention provides electronic devices that can be used in the construction of novel computers and computing devices having greater functionality than today's silicon-based conventional computers. The instant devices are not based on silicon, but rather on chalcogenide phase change materials that can be reversibly transformed between resistive and conductive states. Transformations between states are effected by providing energy to the phase change material in an amount meeting or exceeding a threshold energy. Application of at least a threshold amount of energy from an external source to a resistive state of a chalcogenide material causes at least a portion of the material to switch to a conductive state. The conductive state persists as long as a minimum amount of external energy is provided to the material. Upon termination of the external energy, the material returns to a resistive state.

The instant devices include three or more terminals for connecting the devices to other devices, circuit elements or external energy sources or sinks. The terminals may include input terminals for receiving electrical energy or signals from external devices or sources and providing it to the chalcogenide material as well as output terminals for delivering electrical energy or signals to external devices from the chalcogenide material. The instant devices may include one or more input terminals and one or more output terminals.

The chalcogenide material, through its conductivity, determines the extent to which a signal provided to one terminal is transmitted to, communicated to or otherwise induces a signal in another terminal of the device.

The instant devices include a volume of chalcogenide material and three or more terminals in electrical communication therewith. In a preferred embodiment of the instant invention, the current passing between a source terminal and a drain terminal, both of which are in electrical communication with a chalcogenide material, is controlled though application of an electrical signal to a gate terminal, which is also in electrical communication with the chalcogenide material. The current passing between the source and drain passes through a portion of the chalcogenide material that is in a conductive state and the gate signal modulates the total current passed by modulating the proportion of chalcogenide material that is in a conductive state. By increasing the proportion of chalcogenide material in a conductive state, the current passing from source to drain may be increased and vice versa. The instant devices thus provide transistor-like current amplifying behavior in a non-silicon material.

In one embodiment, a field effect chalcogenide device having three or more terminals, including a gate terminal, in electrical communication with a chalcogenide material is provided where an electrical signal provided to the gate terminal influences the current passing through the chalcogenide material between two non-gate terminals.

In another embodiment, a field effect chalcogenide device having three or more terminals, including a gate terminal, in electrical communication with a chalcogenide material is provided where an optical signal provided to the gate terminal influences the current passing through the chalcogenide material between two non-gate terminals.

The instant devices can be linked to other devices or circuit elements to form a network. In a network, the instant devices may be used as interconnect devices to regulate the flow of electrical current between devices or circuit elements in a network.

DETAILED DESCRIPTION

The instant invention provides field effect electronic devices based on chalcogenide materials. The properties of chalcogenide materials have been previously discussed and include switching effects such as those exploited in OTS (Ovonic Threshold Switch) devices. The OTS has been described in U.S. Pat. Nos. 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p.1450–1453 (1969) by S. R. Ovshinsky; "Amorphous Semiconductors for Switching, Memory, and Imaging Applications", IEEE Transactions on Electron Devices, vol. ED-20, p. 91–105 (1973) by S. R. Ovshinsky and H. Fritzsche; the disclosures of which are hereby incorporated by reference.

Figure 1:
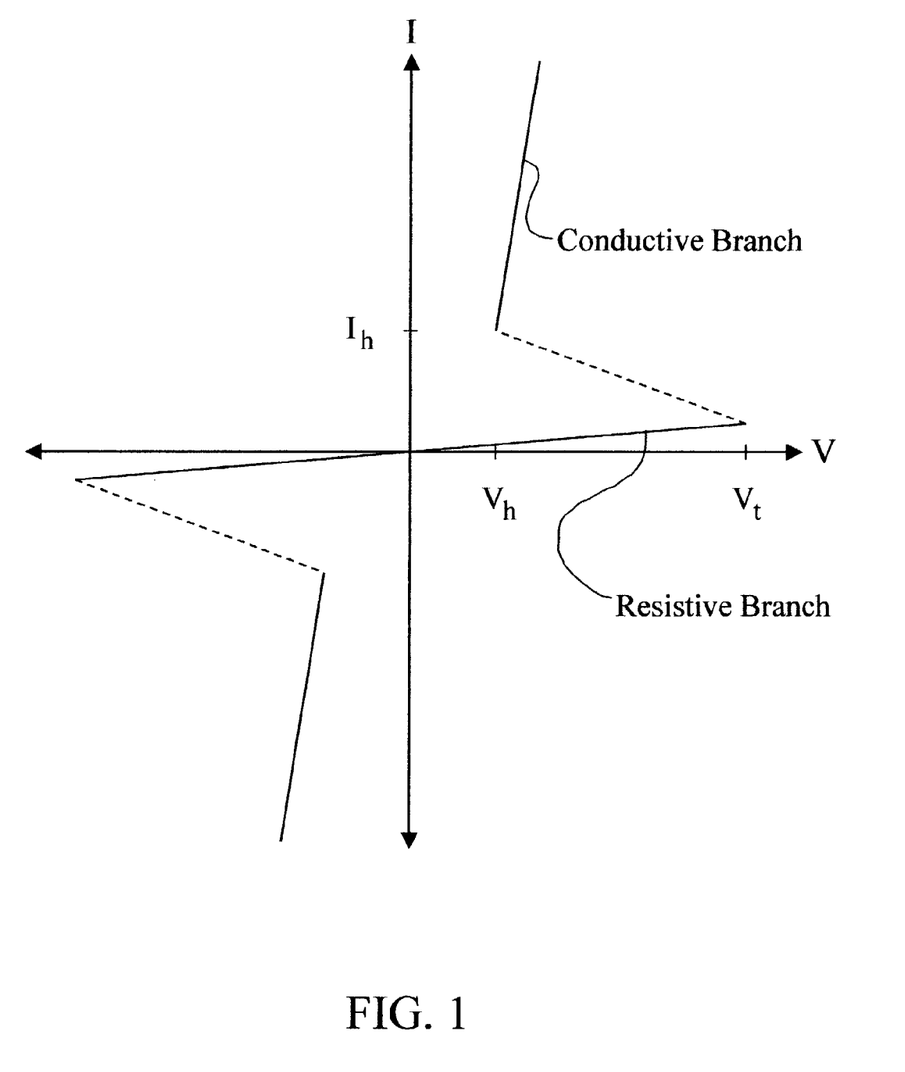
FIG. 1. I–V characteristics of a chalcogenide material.

The electrical switching and current characteristics of chalcogenide materials that pertain to the instant devices are schematically illustrated in FIG. 1, which shows the I–V (current-voltage) characteristics of a chalcogenide material.

The chalcogenide characteristics depicted in FIG. 1 may be conveniently described by considering a simple two-terminal device configuration in which two spacedly disposed electrodes are in contact with a chalcogenide material and the current I corresponds to the current passing between the two electrodes. Analogous characteristics pertain to pairs of terminals in the instant multiterminal devices. The I–V curve of FIG. 1 shows the current passing through a chalcogenide material as a function of the voltage applied across the material by the electrodes. The I–V characteristics of the material are symmetric with respect to the polarity of the applied voltage. For convenience, we consider the first quadrant of the I–V plot of FIG. 1 (the portion in which current and voltage are both positive) in the brief discussion of chalcogenide switching behavior that follows. An analogous description that accounts for polarity applies to the third quadrant of the I–V plot.

The I–V curve of a chalcogenide material in accordance with the instant invention includes a resistive branch and a conductive branch. The branches are labeled in FIG. 1. The resistive branch corresponds to a branch in which the current passing through the material increases only slightly upon increasing the voltage applied across the material. This branch exhibits a small slope in the I–V plot and appears as a more nearly horizontal line in the first and third quadrants of FIG. 1. The conductive branch corresponds to a branch in which the current passing through the material increases significantly upon increasing the voltage applied across the material. This branch exhibits a large slope in the I–V plot and appears as a more nearly vertical line in the first and third quadrants of FIG. 1. The particular slopes of the resistive and conductive branches shown in FIG. 1 are illustrative and not intended to be limiting, the actual slopes will depend on the chemical composition, thickness etc. of the chalcogenide material as well as on parameters such as the resistance, capacitance etc. of surrounding circuit elements. Regardless of the actual slopes, the conductive branch necessarily exhibits a larger (steeper) slope than the resistive branch. When device conditions are such that the chalcogenide material is described by a point on the resistive branch of the I–V curve, the chalcogenide material or device may be said to be in a resistive state. When device conditions are such that the chalcogenide material is described by a point on the conductive branch of the I–V curve, the chalcogenide material or device may be said to be in a conductive state.

The capacity of a chalcogenide material in accordance with the instant invention to carry a current can be described by reference to FIG. 1. We initially consider a two-terminal device configuration in which no voltage difference is present between the terminals. When no voltage is applied across the chalcogenide material, the material is in a resistive state and no current flows. This condition corresponds to the origin of the I–V plot shown in FIG. 1. The chalcogenide remains in a resistive state as the applied voltage is increased, up to a threshold voltage (labeled $V_t$ in the first quadrant of FIG. 1). The slope of the I–V curve for applied voltages between O and $V_t$ is small in magnitude and indicates that the chalcogenide material has a high electrical resistance, a circumstance reflected in the terminology "resistive branch" used to describe this portion of the I–V curve. The high resistance implies low electrical conductivity and as a result, the current flowing through the material increases only weakly as the applied voltage is increased.

When the applied voltage equals or exceeds the threshold voltage, the chalcogenide material transforms or switches from the resistive branch to the conductive branch of the I–V curve. The switching event occurs almost instantaneously and is depicted by the dashed line in FIG. 1. Upon switching, the device voltage decreases significantly and the device current becomes much more sensitive to changes in the device voltage. The chalcogenide material remains in the conductive branch as long as a minimum current, labeled $I_h$ in FIG. 1, is maintained. We refer to $I_h$ as the holding current and the associated voltage $V_h$ as the holding voltage of the device. If the device conditions are changed so that the current becomes less than $I_h$, the material normally returns to the resistive branch of the I–V plot and requires re-application of a threshold voltage to resume operation on the conductive branch. If the current is only momentarily (e.g. a time less than the recovery time of the chalcogenide material) reduced below $I_h$, the conductive state of the chalcogenide may be recovered upon restoring the current to or above $I_h$. The recovery time of chalcogenide materials has been discussed in the article "Amorphous Semiconductors for Switching, Memory, and Imaging Applications" incorporated by reference hereinabove.

Analogous switching behavior occurs in the third quadrant of the I–V plot shown in FIG. 1. Provided one is cognizant of the negative polarity of the I–V curve in the third quadrant, the switching behavior and current characteristics in the third quadrant is analogous to that described hereinabove for the first quadrant. For example, applied voltages having a magnitude greater than the magnitude of the negative threshold voltage in the third quadrant induce a transformation or switching from the resistive branch to the conductive branch.

The instant field effect devices modulate the current flow through a chalcogenide material whose properties are describable by a point on the conductive branch of an I–V curve such as the one shown in FIG. 1. In the instant devices, a signal provided to a gate terminal is used to modulate the current passing through a chalcogenide material from one non-gate terminal to another non-gate terminal when the chalcogenide material is in a conductive state. The current modulation provided by the gate terminal may be described in the context of a phenomenological model applicable to the transformation of a chalcogenide material from a resistive state to a conductive state upon application of a threshold voltage, $V_{th}$. According to the model, application of the threshold voltage causes the formation of a conductive channel or filament within the chalcogenide material. In a typical device configuration, a voltage difference is applied across two terminals in electrical communication with a chalcogenide material and a conductive filament forms within the chalcogenide material between the two terminals. At the threshold voltage, the electric field experienced by portions of the chalcogenide material is sufficiently high to induce a breakdown or avalanche effect whereby electrons are removed from atoms to form a highly conductive, plasma-like filament of charge carriers. Rather than being bound to atoms in bonds or lone pair orbitals, some electrons become unbound and highly mobile. As a result, a conductive channel or filament forms. The conductive filament constitutes a conductive portion or volume within the otherwise resistive chalcogenide material. The conductive filament extends through the chalcogenide material between the device terminals across which the threshold voltage is applied and provides a low resistance pathway for electrical current between those terminals. Portions of the chalcogenide material outside of the filament remain resistive. Since electric current traverses the path of least resistance, the presence of a conductive filament renders the chalcogenide material conductive and establishes a conductive state. The creation of a conductive filament is one event that underlies the transformation of a chalcogenide material from a resistive state to a conductive state.

The conductive filament is maintained between the device terminals as long as the device current remains at or above the holding current. A conductive filament is present for all points along the conductive branch, but the cross sectional area of the filament differs for different points along the conductive branch. The cross sectional area of the filament refers to directions lateral to the direction of current flow. Depending on operating conditions within the conductive branch, the filament can be narrow or wide. As the applied voltage is increased along the conductive branch, the cross section of the filament is enlarged as the applied voltage is increased. The enlarged filament indicates a greater portion or volume of the chalcogenide material is in a conductive state and exhibits high conductivity. As a result, the chalcogenide material can support a greater current, as indicated by the conductive branch of the I–V curve, as the voltage difference applied to the terminals between which current passes increases. Variations of the voltage applied to a chalcogenide material operating in the conductive branch modify the width or thickness of the filament in directions lateral to the direction of current flow. As a result, the cross-sectional area of chalcogenide material in a conductive state and current carrying capacity of a chalcogenide material increase with increasing voltage along the conductive branch. The net effect of varying the applied voltage of a chalcogenide material operating in the conductive branch is to modify the volume fractions of the conductive and resistive portions. As the conductive volume fraction increases, the capacity of the chalcogenide material to pass current increases.

In two terminal chalcogenide devices, the voltage applied across the terminals is used to control or modulate the current carrying capability of a chalcogenide material and hence the current passing through the device. In the instant field effect devices, three or more terminals are connected to and in direct or indirect electrical communication with a chalcogenide material where at least one terminal is a field effect terminal and where signals provided to the field effect terminal create electric fields within or in the vicinity of the chalcogenide material that modulate the current passing through the chalcogenide material between two other terminals. The signals provided to the field effect terminal may also modify other electrical characteristics such as the voltage between other terminals, charge distribution or polarization at or within a chalcogenide material. In the instant devices, the electric field emanating from the field effect terminal does not arise from current flow or carrier injection from the field effect terminal to the chalcogenide material, but rather from a static or dynamic accumulation or withdrawal of charge at the field effect terminal. The charge at the field effect terminal may be within or on the surface of the field effect terminal. Electrical communication between a field effect terminal of the instant devices and the chalcogenide material is indirect in the sense that electric current does not flow from a field effect terminal and a chalcogenide material or from a chalcogenide material to a field effect terminal of the instant devices. A field effect terminal according to the instant invention may also be referred to herein as a gate terminal or gate. The terminals between which current passes may be referred to herein as non-gate terminals. The terminals between which current passes may also be referred to herein as source and drain terminals, where current originates at or is provided at the source terminal, passes through the chalcogenide material and exits at the drain terminal. The electrical communication between non-gate terminals and the chalcogenide material of the instant devices is direct in the sense that electric current can flow from a non-gate terminal to a chalcogenide material or from a chalcogenide material to a non-gate terminal. Gate and non-gate terminals according to the instant invention are distinguished according to their ability (or inability) to transmit or receive electrical current to or from a chalcogenide material in the instant field effect devices. In a preferred embodiment of the instant devices, a signal provided at a gate terminal creates an electric field that modulates or otherwise influences the current passing between the source and drain terminals when the chalcogenide material is in a conductive state.

Figure 2:
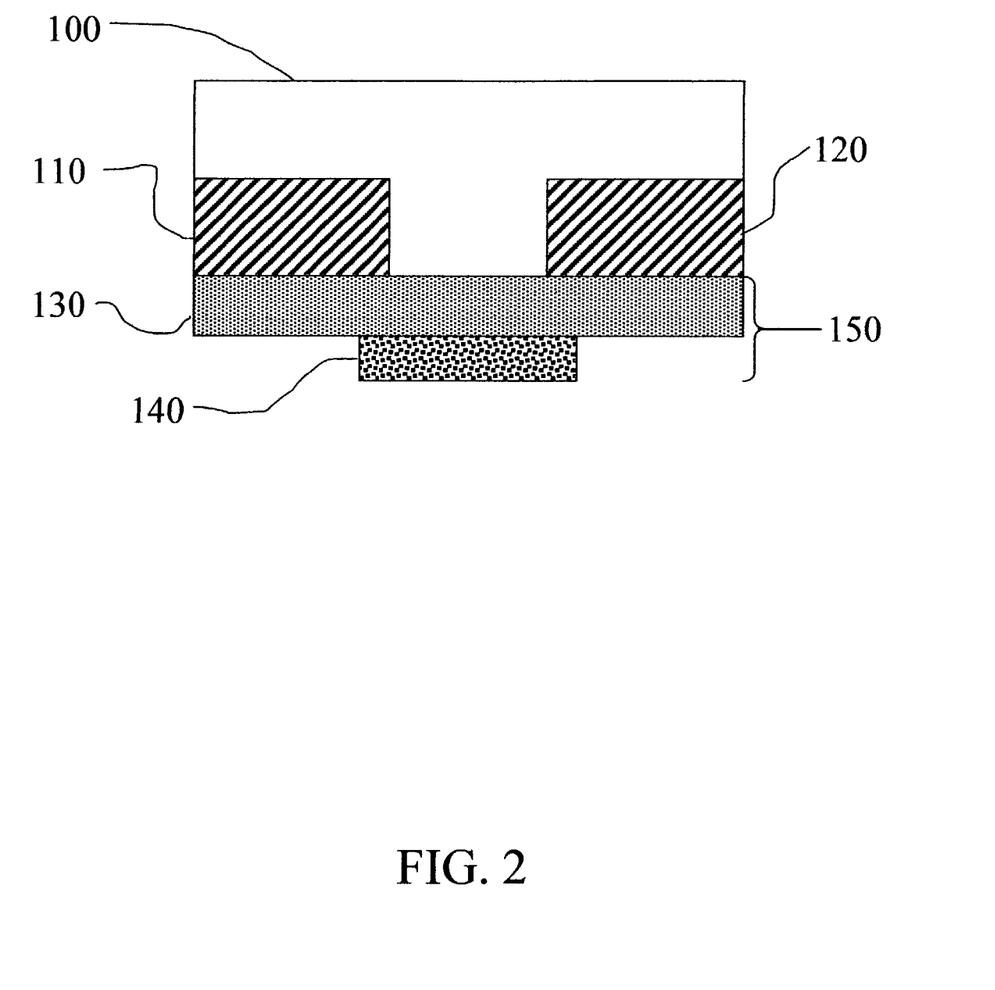
FIG. 2. Schematic depiction of an embodiment of a three-terminal field effect chalcogenide device according to the instant invention.

A typical device structure in accordance with the instant invention is shown in FIG. 2. The device includes chalcogenide material 100, source terminal 110, drain terminal 120, and gate terminal 150 which includes insulating layer 130 and conductive layer 140. The terminals 110, 120 and 150 are connected to and in electrical communication with chalcogenide material 100. The terminals 110 and 120 are formed from a conductive material such as a metal. The electrical communication between terminals 110 and 120 and the chalcogenide material is direct in the sense that current can flow between each terminal and the chalcogenide material. The electrical communication between gate terminal 150 and the chalcogenide is indirect in the sense that current (aside from possible incidental leakage currents) does not flow between the gate terminal and the chalcogenide material, but rather the interaction between the gate terminal and the chalcogenide material occurs through electric fields that are produced at the gate terminal by a gate signal. In a preferred embodiment, the electric field produced at the gate terminal originates from electric charges that form or accumulate therein or thereon or that are removed therefrom, or are otherwise introduced therein or thereon or withdrawn therefrom by the gate signal. The insulating layer 130 acts as a barrier layer to prevent current flow from the gate terminal to the chalcogenide material. The insulating layer 130 thus inhibits the flow of current from the conductive material to the working chalcogenide of an instant device, but is sufficiently thin to allow electric fields present in the conductive material 140 to influence the chalcogenide material. Terminal 150 is thus an embodiment of a field effect terminal according to the instant invention.

In operation, a voltage may be applied across terminals 110 and 120, thereby providing a voltage across chalcogenide material 100. As described hereinabove, when the applied voltage meets or exceeds the threshold voltage of the chalcogenide material, the chalcogenide material is transformed to a conductive state and a filamentary conductive portion forms therein. In the absence of a signal at the gate terminal, the current passing between terminals 110 and 120 is determined by the voltage applied across terminals 110 and 120 as governed by the I–V characteristics of the conductive branch of the I–V curve of the chalcogenide material as described hereinabove when the chalcogenide material is in a conductive state.

Application of a gate signal (e.g. current or voltage) to gate terminal 150 provides an electric field that may extend into chalcogenide material 100 to influence the conductive filamentary portion of the chalcogenide material and/or modulate the current passing through the chalcogenide material. More specifically, the electric field emanating from the gate terminal 150 may expand or contract the conductive filamentary portion relative to its size in the absence of a gate signal. Expansion of the conductive filamentary portion of the chalcogenide material corresponds to an increase in the volume fraction of the chalcogenide material that is in a conductive state, while contraction of the conductive filamentary portion of the chalcogenide material corresponds to a decrease in the volume fraction of the chalcogenide material that is in a conductive state. Expansion or contraction effects may be manifested in the diameter, width, cross-sectional area etc. of the conductive portion of the chalcogenide material. As the conductive portion expands or contracts, the current carried by, passing through or supported by the chalcogenide material changes and is modulated accordingly. The ability of a gate signal to influence the conductive filamentary portion of the chalcogenide material of the instant devices is reminiscent of the ability of a gate signal to influence current in a conventional silicon-based field effect transistor (e.g. JFET or MOSFET) by controlling the width of the current carrying channel through variations in the extent of the depletion region. Expansion or contraction of a conductive filamentary portion may also be accompanied by changes in voltage differences or charge concentration or distribution within or across a chalcogenide material or between terminals connected thereto.

While not wishing to be bound by theory, the instant inventors believe that the electric field emanating from the gate terminal varies the cross-section of the conductive filament by influencing the processes associated with the generation and recombination of charge carriers in the conductive filament. As indicated hereinabove, the conductive filament corresponds to a conductive portion of a chalcogenide material that forms in response to a threshold voltage due to liberation of electrons from lone pair or bonding orbitals of chalcogen and/or modifier elements included in the composition of a chalcogenide material. A conductive filament comprises free or unbound charge carriers having high mobility that readily migrate spatially in the presence of an applied voltage. The expansion or contraction of a conductive filament involves an increase or decrease in the cross section of the filament leading to a change in the volume fraction of chalcogenide material present in a conductive state. An increase in the conductive volume fraction in the presence of a gate signal implies that additional electrons are liberated from the chalcogenide material and transformed from bound states in lone pair or bonding orbitals to unbound states upon incorporation into the conductive filament as it expands. A decrease in the conductive volume fraction in the presence of a gate signal implies that some of the electrons in a conductive filament recombine with electron vacancies (holes) in lone pair or bonding orbitals of atoms and are transformed from unbound states to bound states.

While not wishing to be bound by theory, the instant inventors reason that electrostatic forces resulting from an electric field provided by a gate signal influence the generation and recombination of unbound electrons to thereby influence the cross section of a conductive filament and the current carrying capacity of the chalcogenide material in the instant devices. The conductive filament constitutes a plasma-like collection of unbound or free electrons. Any such collection of electrons is susceptible to attractive and/or repulsive electrostatic forces produced by an electric field provided by a gate signal. A positive gate signal leads to an attractive electrostatic force with a filament comprising electrons, while a negative gate signal leads to a repulsive electrostatic force. These electrostatic forces influence the unbound electrons of the conductive filament in opposite ways and underlie the gate-induced expansion and contraction of the conductive filament.

Expansion and contraction of the conductive filament occurs primarily at the boundary between the conductive filament and the surrounding resistive portion of the chalcogenide material. Filament expansion includes conversion of electrons in lone pair orbitals or bonds of atoms adjacent to the filament and is facilitated by electrostatic forces that weaken the binding energy of those electrons. In the absence of a gate signal, or in a two-terminal device configuration, filament expansion is effected by increasing the applied voltage between a source and drain terminal. The increased voltage leads to liberation of additional electrons by providing an increased electric field strength that facilitates electron liberation and/or by increasing the average energy of existing unbound electrons in the filament thereby facilitating impact ionization processes of conductive filamentary electrons with bound electrons in lone pair and bonding orbitals of atoms in the resistive portion of the chalcogenide material adjacent to the conductive filamentary portion. Impact or electric field induced ionization of traps or defects may also contribute additional charge carriers during filament expansion.

In the instant multi-terminal devices, electrostatic forces provided by a gate signal influence the binding energy of electrons in lone pair or bonding orbitals of atoms in the resistive portion of the chalcogenide material in the vicinity of the conductive filament as well as the kinetic energy of unbound electrons in the conductive filament that induce impact ionization. Electrostatic forces produced by a gate signal that lead to a reduction in the binding energy of bound electrons or an increase in kinetic energy of unbound electrons promote the expansion of a filament. Electrostatic forces produced by a gate signal that lead to an increase in the binding energy of bound electrons or a decrease in the kinetic energy of unbound electrons promote the contraction of a filament.

While not wishing to be bound by theory, the instant inventors envision as one model of filament expansion and contraction a mechanism whereby a dynamic equilibrium occurs at the boundary of the conductive filamentary portion and surrounding resistive portion of the chalcogenide material. In the dynamic equilibrium, the liberation of bound electrons (or generation of free carriers) from lone pair orbitals, bonding orbitals, or defect states to provide conductive, unbound electrons is balanced by a recombination of unbound electrons with holes (electron vacancies) in lone pair orbitals, bonding orbitals or defect states. Electrostatic forces provided by a gate signal can alter the equilibrium and bias it toward greater liberation efficiency (which provides for filament expansion) or greater recombination efficiency (which provides for filament contraction). A gate signal that leads to a higher binding energy of electrons bound in lone pair or bonding orbitals or lower kinetic energy of unbound electrons, for example, biases the equilibrium toward recombination and filament contraction since the liberation of electrons becomes energetically less favorable. Similarly, a gate signal that leads to a lower binding energy of bound electrons or higher kinetic energy of unbound electrons biases the equilibrium toward liberation and filament expansion since the liberation of electrons becomes energetically more favorable. The inclusion of a gate terminal in the device structure thus introduces a degree of freedom in addition to the applied voltage for modulating or otherwise influencing the current passing between two non-gate (e.g. source and drain) terminals of a chalcogenide device. Current levels that are greater than or less than the currents expected for the corresponding two terminal configuration are achievable by applying a signal to a gate terminal to provide electrostatic forces that induce filament expansion or contraction.

In addition to variations in filament dimensions and current flow, a gate signal may also provide a mechanism for controlling the holding current and/or holding voltage of a chalcogenide material. As described hereinabove, the holding current and holding voltage correspond to the minimum current and voltage conditions required to maintain a conductive filament within a chalcogenide material. At the holding conditions, the conductive filament has a size, dimension, volume or cross-section that corresponds to a minimum necessary to maintain the plasma-like conductive filamentary state. The state of the filament at the holding conditions may be referred to as a critical state of the filament. If the current or voltage falls below the holding value, the chalcogenide material transforms from a conductive state to a resistive state as the filament collapses due to recombination of charge carriers. In a two-terminal chalcogenide device, the holding current and voltage are established by the chemical composition of the chalcogenide material, its thickness, etc. and are fixed for a given device configuration. In the instant multi-terminal devices, a gate signal may be used to vary the holding current and/or holding voltage of a chalcogenide material in a given device configuration.

The filamentary expansion effects induced by a gate signal may be accompanied by a decrease in the holding current and/or voltage. As described hereinabove, for a particular voltage applied between two non-gate terminals (e.g. source and drain terminals), a suitable gate signal permits expansion of the conductive filament. If the particular voltage applied between two nongate terminals corresponds to the holding voltage in the absence of a gate signal, the filament is in a critical state. Subsequent application of a suitable gate signal leads to expansion of the filament beyond the dimensions of the critical state in the absence of the gate signal. The filament therefore is no longer in a critical state and is sustainable in the presence of an expansionary gate signal even when the voltage applied between the two non-gate terminals is reduced below the holding value in the absence of the gate signal. Such a reduction of the applied voltage in the presence of an expansionary gate signal leads to a contraction of the filament and opposes the expansion induced by the gate signal. As the reduction of the applied voltage is progressively reduced in the presence of an expansionary gate signal, the filament contracts and ultimately reaches a new critical state that defines new holding conditions in which the holding current and/or voltage is less than that of the material in the absence of a gate signal. The new holding conditions depend on the strength of the gate signal and determine new minimum current and voltage values below which the filament is no longer sustainable in the presence of the gate signal. In an analogous fashion, a gate signal that leads to filament contraction may be used to increase the holding voltage and/or current. Application of a contractionary gate signal, for example, may induce filament collapse of a material operating at the holding conditions in the absence of a gate signal.

The gate signal may be a constant signal or a time varying signal. Application of a constant gate signal provides a constant shift in the current flow and/or holding conditions relative to the current flow and/or holding conditions in the absence of the gate signal, while application of a time varying gate signal provides an oscillating or time varying shift in the current flow and/or holding conditions relative to the current flow and/or holding conditions in the absence of the gate signal. A constant gate signal may be a DC voltage or a long duration voltage pulse. A time varying gate signal may be an AC voltage or a short duration voltage pulse.

A gate signal in accordance with the instant invention provides an electric field, without providing current flow from a gate terminal to a chalcogenide material, that may be used to influence the characteristics of a conductive filament in a chalcogenide material. As described hereinabove, the gate signal may be an electrical signal such as a voltage or charge. The gate signal may also be an optical signal since an optical signal is an electromagnetic signal having an oscillating electric field. The coupling of an electric field from an optical source to the resistive or conductive portions of a chalcogenide material may induce electric fields within a chalcogenide material that are capable of expanding or contracting a filament by influencing the rate of liberation of bound charge carriers or the rate of recombination of unbound charge carriers. Suitable optical sources include incandescent lights, lasers, diodes, light provided by optical fibers or waveguides or light provided by optical chalcogenide materials, including those that contain Se. Optical sources operating in continuous mode or pulsed mode are within the scope of the instant invention.

In embodiments employing an optical gate signal, a physical gate terminal may or may not be present. An optical gate signal may be directly applied to a chalcogenide material or portions thereof. An optical gate signal may also be applied to a physical gate terminal to induce an electric field thereon that is capable of interacting with the chalcogenide material. If a physical gate terminal is present, a combination of an optical gate signal and an electrical gate signal may be employed and such embodiments are within the scope of the instant invention. In a preferred embodiment, the electric field produced by an electrical or optical gate signal originates from charges formed, removed, added, withdrawn or otherwise induced in or on a physical gate terminal or on or within a chalcogenide material.

The embodiment depicted in FIG. 2 is a three terminal device having a first terminal and a second terminal in direct electrical communication with a chalcogenide material and a field effect terminal in indirect electrical communication with a chalcogenide material. In this embodiment, the field effect terminal may be used to modulate the current passing through the chalcogenide material between the first and second terminals or to modify the holding current and/or voltage of the chalcogenide material between the first and second terminals as described hereinabove. The first and second terminals may also be referred to as non-gate terminals, source and drain terminals, or non-field effect terminals. Terminals may also be referred to as electrodes and may include terminals containing a single layer or chemical composition as well as terminals comprising two or more layers.

In a preferred embodiment, non-gate terminals comprise a conductive material and field effect terminals comprise a conductive material in combination with an insulating barrier layer where the barrier material is in contact with the chalcogenide material of the device. In still another embodiment, a gate or non-gate terminal may include a chalcogenide material. A chalcogenide terminal may also include a conductive layer disposed on a chalcogenide material or a chalcogenide material disposed between two conductive materials. In these embodiments, the chalcogenide terminal may be a two-terminal chalcogenide device, such as an Ovonic Threshold Switch, where the conductivity of the terminal is controlled by the resistivity of the chalcogenide material included in the terminal. A memory type chalcogenide material may also be used. In these embodiments, the chalcogenide terminal can be resistive or conductive, depending on whether the chalcogenide material is in a resistive or conductive state. A conductive chalcogenide terminal permits passage of an electric current to the working chalcogenide material of an instant field effect device and is thus an embodiment of a non-gate terminal. A resistive chalcogenide material inhibits or prevents passage of electric current to the working chalcogenide material of an instant field effect device and is thus an embodiment of a gate or field effect terminal.

Embodiments having more than three terminals are also within the scope of the instant invention. In these embodiments, devices having a plurality of source, drain, gate, non-gate etc. terminals are within the scope of the instant invention. Embodiments having a source terminal, a drain terminal and two or more gate terminals are also within the scope of the instant invention. In these embodiments, each of the two or more gate terminals may influence the current flowing between a source terminal and a drain terminal and/or the holding conditions of the chalcogenide material. Each of a plurality of gate terminals may function independently or in concert with other gate terminals to influence a conductive filament. Embodiments having a plurality of source terminals and/or a plurality of drain terminals are also within the scope of the instant invention. In such embodiments, application of voltages across more than one pair of source and drain terminals may produce a plurality of conductive filaments where the different conductive filaments are spatially separated or overlapping. Application of a gate signal in these embodiments may influence individual conductive filaments or combinations thereof. The relative influence of a gate terminal on a particular conductive filament depends on the strength of the electric field emanating from the gate terminal at the position of the conductive filament. The strength, in turn, depends on the spatial proximity of a conductive filament relative to the gate terminal. The closer a filament is to a gate terminal, the stronger the electric field it experiences by virtue of a gate signal at the gate terminal and the greater the influence of the gate terminal on the filament. In embodiments in which it is possible to sustain a plurality of filaments, application of one or more gate signals may induce overlapping of spatially separated filaments upon inducement of filament expansion or decoupling or resolution of overlapping filaments upon inducement of filament contraction. Preferred embodiments of the instant invention are those in which different terminals are electrically isolated from one another in the sense that current flow between any pair of non-gate terminals occurs through the chalcogenide material and no current flows to or from a gate terminal through the chalcogenide material.

The terminals of the instant devices may be located in various spatial configurations. All terminals, for example, may be in a common plane or layer or two-dimensional circuit. Alternatively, one or more terminals may be positioned outside of a plane in which other terminals reside. A three terminal device according to the instant invention, for example, may have two terminals and a chalcogenide material in a common horizontal layer and a third terminal vertically disposed relative to that layer. Such a configuration provides for a vertical interconnection capability. Analogous embodiments for devices having more than three terminals are also within the scope of the instant invention.

The instant field effect devices may be combined with other devices or elements to form circuits or networks. In one embodiment, the instant devices may be used as interconnection devices between two or more elements. In this embodiment, the instant devices regulate the flow of current passing between two or more interconnected elements. The instant field effect device may, for example, interconnect two circuit elements. In this example, the instant field effect device may include a gate terminal, a source terminal and a drain terminal where one circuit element is connected to the source terminal and another circuit element is connected to the drain terminal. Voltages provided by the interconnected circuit elements constitute an applied voltage across the source and drain terminals and if the applied voltage exceeds the threshold voltage, the chalcogenide material of the instant field effect device is placed into a conductive state and a current may pass from one circuit to the other circuit element through the chalcogenide material of the instant field effect device by way of a conductive filament. Application of a gate signal to the field effect device of this example provides a way to regulate the current flow between the two interconnected circuit elements through the expansion or contraction of the conductive filament. Expansion of the filament permits more current to flow between the two interconnected elements, while contraction of the filament inhibits current flow between the interconnected devices. A gate signal may also transform the chalcogenide material of the instant field effect device from a conductive state to a resistive state thereby substantially preventing the flow of current between the two interconnected circuit elements.

Corresponding embodiments having more than one source and/or drain terminals in which a field effect terminal modulates the current passing between circuit elements interconnected to one or more pairs of source and drain terminals are also within the scope of the instant invention. A field effect device according to the instant invention may, for example, include a plurality of source terminals, one drain terminal and one field effect terminal where different circuit or network elements are interconnected to the source and drain terminals and where the field effect terminal regulates current flow between one or more of the source terminals and the drain terminal. Similar embodiments having a plurality of drain terminals in which a gate terminal influences the current passing between one or more source terminals and one or more drain terminals are also within the scope of the instant invention. Also within the scope of the instant invention are embodiments having a plurality of gate terminals where each of the gate terminals can influence the current passing between one or more pairs of source and drain terminals. In any of the embodiments of the instant invention, one or more field effect terminals may, in addition to modulating current flow, also modify the holding current and/or voltage of the chalcogenide material between any pair of non-field effect terminals.

The gate signal provided to a field effect terminal in embodiments that incorporate the instant multi-terminal devices as an interconnection device in a circuit or network may be provided as a direct signal from an external energy source (e.g. current or voltage pulse generator, optical source etc.) or may be provided by a circuit or network element interconnected to a gate terminal. In the latter embodiment, the gate signal is produced by an element interconnected to the gate terminal and the operation of the interconnected element regulates the flow of current or holding conditions between one or more pairs of non-gate terminals.

Interconnected circuit or network elements include single devices such as transistors, diodes, silicon devices, other chalcogenide devices etc. as well as circuits or networks comprising a plurality of such devices. The interconnection of circuits or network elements may be in a two-dimensional configuration or in a vertical or three-dimension configuration. One or more terminals may be vertically disposed or otherwise non-co-planar with the chalcogenide material or other terminals. A gate signal, for example, may be provided from a terminal or device orthogonal to a plane in which a chalcogenide material or source and/or drain terminals may reside.

The instant invention generally provides multi-terminal field effect chalcogenide devices that operate separately or in combination with each other or in combination with other devices or as elements within circuits or networks. The instant devices generally employ a field effect terminal connected to a chalcogenide material to which a gate signal may be provided to influence the electrical characteristics of a chalcogenide material or electrical interactions between two or more non-gate terminals connected to the chalcogenide material. The current, voltage, charge distribution etc. between or at two or more non-gate terminals may be influenced by providing a gate signal to a field effect terminal of the instant devices.

Chalcogenide materials of many chemical compositions may be included in the instant multi-terminal field effect devices. Representative chalcogenide materials are those that include one or more elements from column VI of the periodic table (the chalcogen elements) and optionally one or more chemical modifiers from columns III. IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament. Materials that include Ge, Sb, and/or Te, such as $Ge_2Sb_2Te_5$, are examples of chalcogenide materials in accordance with the instant invention.

Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and leads to a broad classification of chalcogenide materials, according to their ability to undergo crystallization or other structural rearrangements, into one of two types: threshold materials and memory materials.

Both types of chalcogenide materials display the behavior shown in FIG. 1, but differ in their structural response to filament formation. Threshold materials generally possess a higher concentration of modifiers and are more highly crosslinked than memory materials. They are accordingly more rigid structurally. Threshold materials are amorphous and show little or no tendency to crystallize because the atomic rearrangements required to nucleate and grow a crystalline phase are inhibited due to the rigidity of the structure. Threshold materials remain amorphous upon removing the applied voltage after switching.

Memory materials, on the contrary, are lightly crosslinked and more easily undergo full or partial crystallization. An amorphous memory material undergoes filament formation in the presence of a threshold voltage as described in FIG. 1 hereinabove. Once in the conductive branch, however, the memory material may undergo nucleation and growth of a crystalline phase. The volume fraction of the crystalline phase depends on the magnitude and time of the current passing through the memory material. Any crystalline phase formed is retained upon removing the applied voltage after switching. Through appropriate selection of device operating conditions, the amorphous-crystalline transformation of chalcogenide memory materials becomes reversible over many cycles. Chalcogenide memory materials have been discussed in U.S. Pat. Nos. 5,166,758; 5,296,716; 5,534,711; 5,536,947; 5,596,522; and 6,087,674; the disclosures of which are hereby incorporated by reference.

The disclosure and discussion set forth herein is illustrative and not intended to limit the practice of the instant invention. Numerous equivalents and variations thereof are envisioned to be within the scope of the instant invention. It is the following claims, including all equivalents, in combination with the foregoing disclosure, which define the scope of the instant invention.

I claim:

1. A field effect device comprising:
   a chalcogenide material, said chalcogenide material having a conductive state and a resistive state, said conductive state comprising a conductive filament;
   a first terminal connected to said chalcogenide material;
   a second terminal connected to said chalcogenide material;
   and a field effect terminal connected to said chalcogenide material:
   wherein said conductive state is formed from said resistive stare by applying a voltage between said first and second terminals.

2. The device of claim 1, wherein a gate signal provided to said field effect terminal modifies the width or cross-section of said filament.

3. The device of claim 1, wherein a gate signal provided to said field effect terminal modifies the holding current or holding voltage of said chalcogenide material.

4. The device of claim 1, wherein a gate signal provided to said field effect terminal modulates the current passing through said chalcogenide material.

5. The device of claim 4, wherein said gate signal produces an electric field emanating from said field effect terminal, said electric field effecting said modulation of the current passing through said chalcogenide material.

6. The device of claim 4, wherein said gate signal is provided in the form of a voltage or current.

7. The device of claim 4, wherein said gate signal is provided in the form of an optical signal.

8. The device of claim 4, wherein said gate signal adds or removes charge from said field effect terminal.

9. The device of claim 4, wherein said gate signal is an alternating or pulsed signal.

10. The device of claim 1, wherein said field effect terminal comprises an insulating material and a conductive material, said conductive material being in physical contact with said insulating material, said conductive material not being in physical contact with said chalcogenide material.

11. A circuit comprising a first element, a second element and an interconnection element connecting said first and second elements, said interconnection element controlling the current passing between said first and second elements, said interconnection element comprising the device of claim 1.

12. The circuit of claim 11, further comprising a third element, said third element being connected to the field effect terminal of said interconnection element, said third element providing a signal to said field effect terminal, said signal effecting said control of current passing between said first and second elements.

* * * * *